United States Patent
Yamazaki

(10) Patent No.: US 7,081,646 B2
(45) Date of Patent: Jul. 25, 2006

(54) SEMICONDUCTOR DEVICE AND METHOD OF FABRICATING SAME

(75) Inventor: Shunpei Yamazaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/939,767

(22) Filed: Aug. 28, 2001

(65) Prior Publication Data

US 2002/0006712 A1 Jan. 17, 2002

Related U.S. Application Data

(62) Division of application No. 09/094,345, filed on Jun. 10, 1998, now Pat. No. 6,303,415.

(30) Foreign Application Priority Data

Jun. 10, 1997 (JP) ................................ 9-168021

(51) Int. Cl.
*H01L 29/04* (2006.01)
*H01L 29/76* (2006.01)
*H01L 31/119* (2006.01)
*H01L 29/94* (2006.01)

(52) U.S. Cl. .................. 257/213; 257/61; 257/403; 257/902

(58) Field of Classification Search .............. 257/64, 257/66, 69, 75, 255; 438/150, 166
See application file for complete search history.

(56) References Cited

U.S. PATENT DOCUMENTS

| 4,892,835 A | * | 1/1990 | Rabinzohn et al. ......... 438/184 |
| 5,403,772 A | | 4/1995 | Zhang et al. |
| 5,426,064 A | * | 6/1995 | Zhang et al. ............... 438/166 |
| 5,459,090 A | * | 10/1995 | Yamazaki et al. .......... 438/154 |
| 5,481,121 A | | 1/1996 | Zhang et al. |
| 5,488,000 A | | 1/1996 | Zhang et al. |
| 5,492,843 A | | 2/1996 | Adachi et al. |
| 5,501,989 A | | 3/1996 | Takayama et al. |
| 5,508,533 A | | 4/1996 | Takemura |
| 5,529,937 A | | 6/1996 | Zhang et al. |
| 5,534,716 A | | 7/1996 | Takemura |
| 5,543,352 A | | 8/1996 | Ohtani et al. |
| 5,550,070 A | * | 8/1996 | Funai et al. ................ 438/486 |

(Continued)

FOREIGN PATENT DOCUMENTS

JP 05-109737 4/1993

(Continued)

OTHER PUBLICATIONS

Wolf et al., Silicon Processing for the VLSI Era (1990), Lattice Press, vol. 2, p. 186.*

(Continued)

*Primary Examiner*—Carl Whitehead, Jr.
*Assistant Examiner*—James M. Mitchell
(74) *Attorney, Agent, or Firm*—Eric J. Robinson; Robinson Intellectual Property Law Office, P.C.

(57) ABSTRACT

There are disclosed TFTs that have excellent characteristics and can be fabricated with a high yield. The TFTs are fabricated, using an active layer crystallized by making use of nickel. Gate electrodes are comprising tantalum. Phosphorus is introduced into source/drain regions. Then, a heat treatment is performed to getter nickel element in the active layer and to drive it into the source/drain regions. At the same time, the source/drain regions can be annealed out. The gate electrodes of tantalum can withstand this heat treatment.

30 Claims, 6 Drawing Sheets

U.S. PATENT DOCUMENTS

| | | | |
|---|---|---|---|
| 5,563,426 A | 10/1996 | Zhang et al. | |
| 5,569,610 A | 10/1996 | Zhang et al. | |
| 5,569,936 A | 10/1996 | Zhang et al. | |
| 5,580,792 A | 12/1996 | Zhang et al. | |
| 5,585,291 A | 12/1996 | Ohtani et al. | |
| 5,589,694 A | 12/1996 | Takayama et al. | |
| 5,595,923 A | 1/1997 | Zhang et al. | |
| 5,595,944 A | 1/1997 | Zhang et al. | |
| 5,604,360 A | 2/1997 | Zhang et al. | |
| 5,605,846 A | 2/1997 | Ohtani et al. | |
| 5,606,179 A | 2/1997 | Yamazaki et al. | |
| 5,608,232 A | 3/1997 | Yamazaki et al. | |
| 5,612,250 A | 3/1997 | Ohtani et al. | |
| 5,614,426 A | 3/1997 | Funada et al. | |
| 5,614,733 A | 3/1997 | Zhang et al. | |
| 5,616,506 A | 4/1997 | Takemura | |
| 5,620,910 A | 4/1997 | Teramoto | |
| 5,621,224 A | 4/1997 | Yamazaki et al. | |
| 5,624,851 A | 4/1997 | Takayama et al. | |
| 5,637,515 A | 6/1997 | Takemura | |
| 5,639,698 A | 6/1997 | Yamazaki et al. | |
| 5,643,826 A | 7/1997 | Ohtani et al. | |
| 5,646,424 A | 7/1997 | Zhang et al. | |
| 5,654,203 A | 8/1997 | Ohtani et al. | |
| 5,656,825 A | 8/1997 | Kusumoto et al. | |
| 5,663,077 A | 9/1997 | Adachi et al. | |
| 5,677,549 A | 10/1997 | Takayama et al. | |
| 5,696,386 A | 12/1997 | Yamazaki | |
| 5,696,388 A | 12/1997 | Funada et al. | |
| 5,700,333 A | 12/1997 | Yamazaki et al. | |
| 5,705,829 A | 1/1998 | Miyanaga et al. | |
| 5,712,191 A | 1/1998 | Nakajima et al. | |
| 5,764,321 A * | 6/1998 | Koyama et al. | 349/48 |
| 5,773,846 A | 6/1998 | Zhang et al. | |
| 5,808,321 A | 9/1998 | Mitanaga et al. | |
| 5,815,226 A | 9/1998 | Yamazaki et al. | |
| 5,837,619 A | 11/1998 | Adachi et al. | |
| 5,843,225 A | 12/1998 | Takayama et al. | |
| 5,864,151 A | 1/1999 | Yamazaki et al. | |
| 5,869,363 A | 2/1999 | Yamazaki et al. | |
| 5,888,858 A | 3/1999 | Yamazaki et al. | |
| 5,897,347 A | 4/1999 | Yamazaki et al. | |
| 5,915,174 A | 6/1999 | Yamazaki et al. | |
| 5,946,560 A * | 8/1999 | Uochi et al. | 438/162 |
| 5,952,708 A | 9/1999 | Yamazaki | |
| 5,961,743 A | 10/1999 | Yamazaki et al. | |
| 5,966,594 A | 10/1999 | Adachi et al. | |
| 5,977,559 A | 11/1999 | Zhang et al. | |
| 5,990,542 A | 11/1999 | Yamazaki | |
| 6,060,725 A | 5/2000 | Zhang et al. | |
| 6,066,518 A | 5/2000 | Yamazaki | |
| 6,072,193 A | 6/2000 | Ohnuma et al. | |
| 6,087,679 A | 7/2000 | Yamazaki et al. | |
| 6,118,506 A | 9/2000 | Yamazaki et al. | |
| 6,121,660 A | 9/2000 | Yamazaki et al. | |
| 6,133,075 A | 10/2000 | Yamazaki et al. | |
| 6,133,119 A | 10/2000 | Yamazaki | |
| 6,169,293 B1 | 1/2001 | Yamazaki | |
| 6,210,997 B1 | 4/2001 | Adachi et al. | |
| 6,239,470 B1 | 5/2001 | Yamazaki | |
| 6,251,712 B1 | 6/2001 | Tanaka et al. | |
| 6,261,875 B1 | 7/2001 | Zhang et al. | |
| 6,441,468 B1 | 8/2002 | Yamazaki | |
| 6,445,059 B1 | 9/2002 | Yamazaki | |
| 6,465,284 B1 | 10/2002 | Adachi et al. | |
| 6,518,102 B1 | 2/2003 | Tanaka et al. | |
| 6,541,313 B1 | 4/2003 | Zhang et al. | |
| 6,787,887 B1 | 9/2004 | Yamazaki | |
| 6,800,875 B1 * | 10/2004 | Yamazaki | 257/72 |
| 6,830,617 B1 | 12/2004 | Ohtani et al. | |
| 6,855,580 B1 | 2/2005 | Tanaka et al. | |
| 6,867,434 B1 | 3/2005 | Yamazaki | |
| 6,939,749 B1 | 9/2005 | Zhang et al. | |
| 2001/0019860 A1 | 9/2001 | Adachi et al. | |
| 2002/0048894 A1 | 4/2002 | Zhang et al. | |
| 2003/0134459 A1 * | 7/2003 | Tanaka et al. | 438/151 |
| 2003/0162337 A1 | 8/2003 | Zhang et al. | |
| 2005/0037554 A1 | 2/2005 | Ohtani et al. | |

FOREIGN PATENT DOCUMENTS

| | | | |
|---|---|---|---|
| JP | 06-267978 | | 9/1994 |
| JP | 07-066426 | | 3/1995 |
| JP | 07-202209 | | 8/1995 |
| JP | 408213317 | * | 9/1996 |
| JP | 08-330602 | | 12/1996 |
| JP | 09-045616 | | 2/1997 |

OTHER PUBLICATIONS

Merriam-Webster'Collegiate Dictionary (2001), Merriam-Webster Inc., Tenth Edition, pp. 164, 535 and 994.*

* cited by examiner

SEMICONDUCTOR DEVICE AND METHOD OF FABRICATING SAME

BACKGROUND OF THE INVENTION

1. Field of the Invention

The present invention relates to a method of fabricating TFTs.

2. Description of Related Art

Thin-film transistors (TFTs) using an amorphous silicon film as an active layer have been well known. TFTs using this amorphous silicon film as an active layer are employed in active matrix liquid crystal displays (AMLCDs).

However, TFTs using an amorphous silicon film have low characteristics and so the P-channel type cannot be put into practical use. Therefore, the actual situation is that the use of the TFTs using an amorphous silicon film is limited to active matrix circuits.

An active matrix liquid crystal display with which peripheral driver circuits are integrated to reduce the fabrication cost and to miniaturize the liquid crystal panel is also known. In this configuration, even the peripheral driver circuits are composed of TFTs. Therefore, this kind of display must meet some requirements, i.e., high-speed operation and realization of P-channel TFTs.

TFTs using a crystalline silicon film are known as a configuration satisfying these requirements. One main method of obtaining a crystalline silicon film is heat treatment for an amorphous silicon film. Another main method is to irradiate the amorphous silicon film with laser light.

The former method results in a clear polycrystalline state. However, the electrical characteristics tend to be nonuniform because of clear crystal grain boundaries. This problem is deeply concerned with the fact that the positions and the state of the crystal grain boundaries cannot be controlled.

The latter method can produce a crystalline silicon film of uniform quality. However, the production yield is low. In addition, the crystallinity is not sufficiently high.

In an attempt to solve these problems, we have proposed a technique for obtaining a crystalline silicon film having desired film quality and electrical characteristics. In particular, nickel is introduced into an amorphous silicon film, and then a heat treatment is performed.

However, doping is utilized in forming source and drain regions. The resulting damage must be healed. Nickel element remaining in the active layer adversely affects the characteristics of the completed device. These problems must be alleviated.

SUMMARY OF THE INVENTION

It is an object of the present invention to provide a method of fabricating TFTs in which the foregoing problems have been mitigated.

One embodiment of the present invention lies in a device comprising: a gate electrode comprising a heat-resistant material; and an active layer comprising a semiconductor film comprising silicon to which a catalytic element is intentionally added to promote crystallization of silicon. The source and drain regions of the active layer are more heavily doped with the metallic element than other regions.

Tantalum or a material mainly comprising tantalum can be used as the heat-resistant material described above. Nickel can be the most favorable element as the catalytic element for promoting crystallization of silicon.

In the configuration described above, the concentration of the catalytic element in the source and drain regions is higher than in other regions by two or more orders of magnitude. This can lower the catalytic element concentration in the channel region. In consequence, the characteristics and reliability of the finished TFTs can be enhanced.

More particularly, the concentration of the catalytic element in the channel region is reduced less than $5 \times 10^{16}$ atoms/cm$^3$. Consequently, the characteristics and the reliability of the TFTs can be improved.

One or more elements selected from the group consisting of Fe, Co, Ru, Rh, Pd, Os, Ir, Pt, Cu, and Au can be used as the aforementioned catalytic element, though the merits are less conspicuous than where nickel is used alone. Furthermore, Ni may be added to one or more elements selected from this group, and the resulting compound may be used together with other catalytic element.

Another structure of the invention lies in a method of fabricating a semiconductor device having a gate electrode comprising a heat-resistant material and an active layer comprising a semiconductor film comprising silicon to which a catalytic element for promoting crystallization of silicon is added. This method starts with forming an active layer comprising a crystalline semiconductor film comprising silicon by using of the catalytic element described above. Phosphorus is introduced into regions to be source and drain. A heat treatment is performed at 550 to 700° C. to getter the catalytic element in the active layer to the phosphorus-doped regions.

Other objects and features of the invention will appear in the course of the description thereof, which follows.

DETAILED DESCRIPTION OF THE PREFERRED EMBODIMENTS

In the present invention, TFTs using gate electrodes comprising a heat-resistant metal typified by tantalum are formed. The TFTs use an active layer fabricated from a silicon film crystallized, using nickel element. During the fabrication, phosphorus is introduced into the source/drain regions. Then, a heat treatment is performed at 550 to 700° C. The heat treatment can getter the nickel element toward the source/drain regions and, at the same time, anneal out the source/drain regions.

FIRST EMBODIMENT

In the present embodiment, N-channel TFTs are fabricated. The process sequence of the present embodiment is illustrated in FIGS. 1A–1E. In the present embodiment, a glass substrate 101 is used as a substrate. A silicon oxide film (not shown) is formed on the surface of this glass substrate. A Corning 1737 glass substrate having, a strain point of 667° C. is used as the glass substrate 101 in this embodiment.

First, an amorphous silicon film 102 is formed on the glass 10 substrate 101 to a thickness of 50 nm by LPCVD. Then, nickel element is introduced into the surface of the amorphous silicon film. In this example, a nickel acetate solution adjusted to a desired nickel concentration is applied to the surface of the amorphous silicon film 102. Thus, nickel element is introduced into the amorphous silicon film.

Figure 1A:
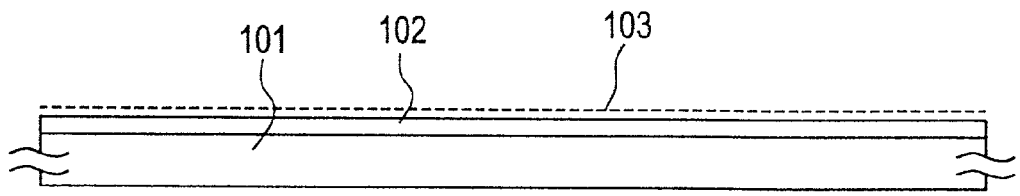
FIGS. 1A–1E are cross-sectional views illustrating a process sequence for fabricating a TFT in accordance with the present invention.
Figure 1B:
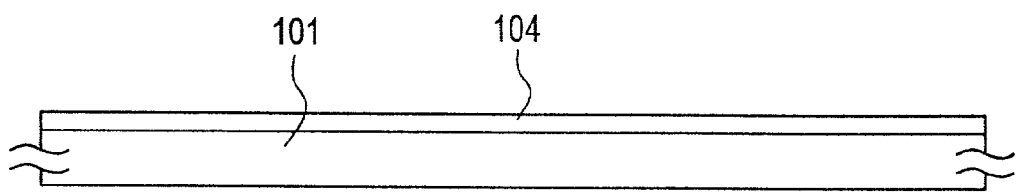

In this manner, a state shown in FIG. 1A is obtained. Then, a heat treatment is conducted at 600° C. for 8 hours in a nitrogen atmosphere to crystallize the amorphous silicon film 102. In consequence, a crystalline silicon film 104 is obtained. This crystallization is promoted by the action of the nickel element (FIG. 1B).

Under this condition, nickel element is distributed within the crystalline silicon film at a relatively high concentration of about $10^{18}$ atoms/cm$^3$ or more. This cannot be fully avoided because the crystallization progresses with diffusion of the nickel element.

After obtaining the crystalline silicon film 104, this is patterned to form an active layer pattern (not shown) for TFTs. Source/drain regions, a channel region, and highly resistant regions are formed in this active layer pattern.

Figure 1C:
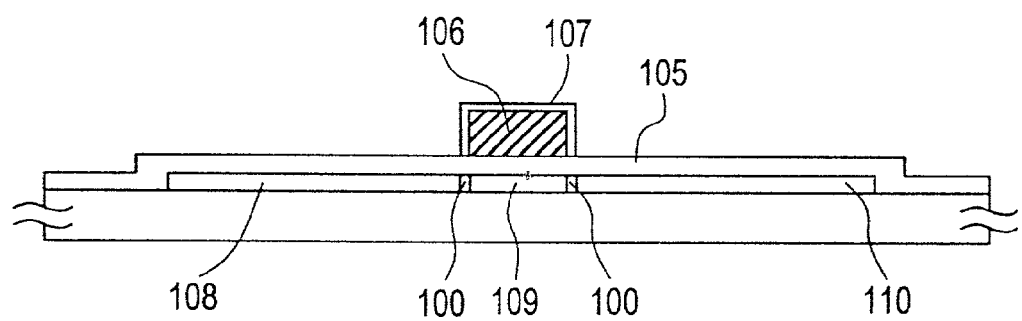

Then, a silicon oxide film 105 is formed as a gate insulator film having a thickness of 100 nm by plasma CVD (FIG. 1C). In FIG. 1C, the pattern consisting of regions 108, 100, 109, and 110 are the active layer.

Thereafter, a titanium layer (not shown) is deposited to a thickness of 400 nm by sputtering and patterned it to create a pattern 106, which will become a gate electrode.

An anodic oxide film 107 is formed to a thickness of 200 nm on the exposed surface of the titanium film pattern 106 by anodic oxidation (FIG. 1C). This anodic oxide film protects the surface of the gate electrode both electrically and physically. This anodic oxide film will later function to form a highly resistant region (known as an offset region) adjacent to the channel region.

Then, phosphorus is introduced, using the gate electrode 106 and A the surrounding anodic oxide film 107 as a mask. The implanted phosphorus acts as a dopant determining the source and drain regions. The phosphorus also serves as a gettering material for concentrating nickel element in the source and drain regions. The introduction of phosphorus produces the source region 108, the drain region 110, the channel region 109, and the highly resistant region 100 in a self-aligned manner (FIG. 1C).

Thereafter, a heat treatment is again performed to concentrate the nickel element, which is substantially uniformly distributed over the whole active layer, in the source region 108 and in the drain region 110. This heat treatment is conducted in a nitrogen atmosphere at 640° C. for 1 hour. The heating temperature may be determined, taking account of the heat resistance of the glass substrate. In this example, a glass substrate having a strain point of 667° C. is used and so the heating temperature is set to 640° C. Generally, at a temperature of 600° C., nickel element violently migrates. On the other hand, phosphorus element hardly moves.

Figure 1D:
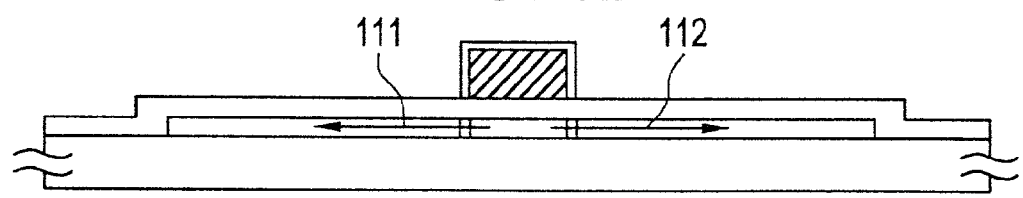

Phosphorus and nickel are bonded in various forms such as NiP, NiP$_2$, and Ni$_2$P. In addition, these forms are very stable. Compounds of phosphorus and nickel are collectively known as nickel phosphides. Therefore, owing to the heat treatment described above, nickel element has moved into the regions 108 and 110 from the regions 100 and 109, as shown in FIG. 1D. In particular, the concentration of nickel phosphides in the regions 108 and 110 increases. Concomitantly, the nickel concentration in the regions 100 and 109 decreases. In this state, nickel element has been gettered into the source and drain regions (FIG. 1D).

The aforementioned heat treatment activates the source and drain regions. That is, the damage to the crystal structure induced by the doping is annealed out. Simultaneously, the dopant is activated. To assure the annealing of the source/drain regions, laser annealing may be performed after the heat treatment.

Figure 1E:
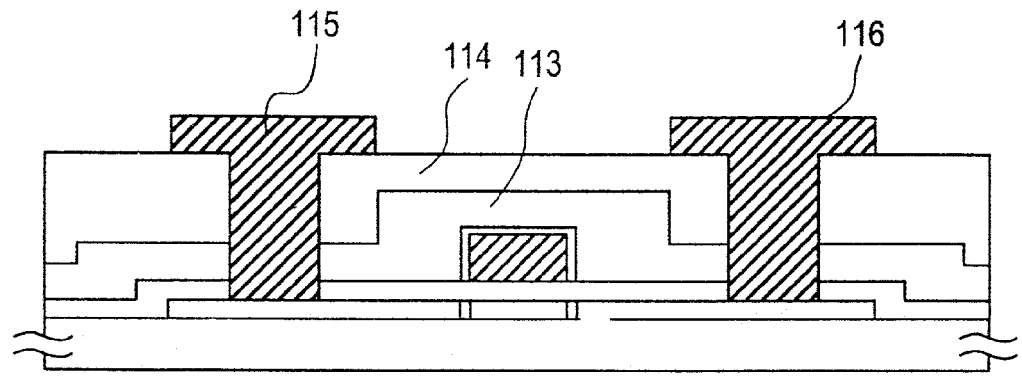

Then, as shown in FIG. 1E, a silicon nitride film 113 is formed as an interlayer insulating film to a thickness of 150 nm by plasma CVD. Subsequently, an acrylic resin film 114 is formed. The minimum film thickness of the acrylic resin film is 700 nm. The resinous film can flatten the surface. Besides acrylics, other materials such as polyimide, polyamide, polyimidamide, and epoxies can be used. The resinous film can be a multilayer film.

Thereafter, contact holes are created, and a source electrode 115 and a drain electrode 116 are formed. In this way, an N-channel TFT is completed (FIG. 1E).

The TFT shown in FIG. 1E is characterized in that the nickel element existing in the channel region 109 and in the adjacent, highly resistant region 100 has been gettered and shifted into the source region 108 and into the drain region 110.

The channel region 109 and the adjacent, highly resistant region 100 greatly influence the operation of the TFT. The existence of nickel element in these regions deleteriously affect the operation of the TFT. In particular, various problems such as deterioration of the characteristics, nonuniformity of the characteristics among individual devices, and deterioration of the reliability take place.

On the other hand, neither the conductivity type nor the resistivity of the source/drain regions varies. Therefore, if these regions comprises nickel at a high concentration, the operation of the TFT is little affected, whether the device is the N-channel type or the P-channel type. Accordingly, the present invention can suppress the adverse affect of nickel element on the operation of the TFT.

SECOND EMBODIMENT

The present embodiment gives an example of an improvement of the process sequence of the first embodiment. The present embodiment pertains to a process step for taking nickel element out of a region becoming an active region before this active layer is formed, in order to reduce the nickel element concentration in the active layer of the TFT.

Figure 2A:
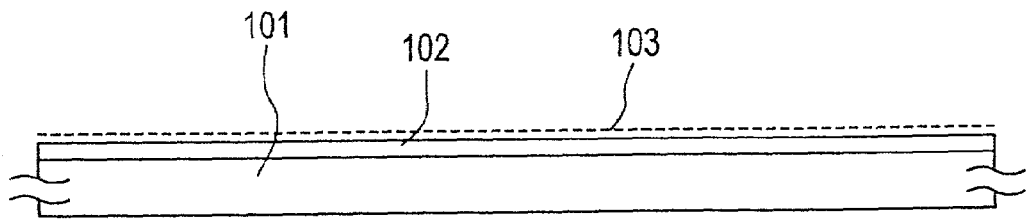
FIGS. 2A–2E are cross-sectional views illustrating another process sequence for fabricating a TFT in accordance with the invention.

The process sequence of the present embodiment is illustrated in FIGS. 2A–2E. First, as shown in FIG. 2A, nickel element is maintained, as indicated by 103, in contact with the surface of the amorphous silicon film 102 formed on the glass substrate 101. In the present embodiment, a nickel acetate solution is used in introducing nickel element, in the same way as in the first embodiment.

Figure 2B:
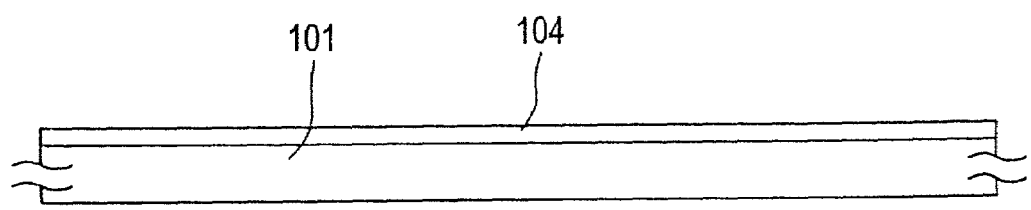
Figure 2C:
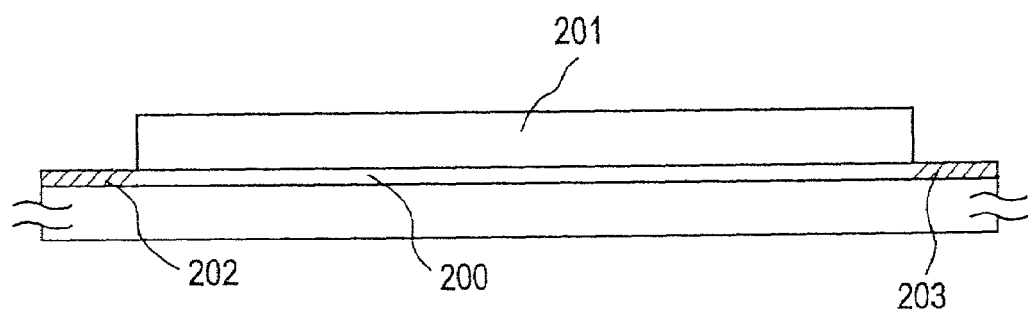
Figure 2D:

Then, a heat treatment is performed to obtain the crystalline silicon film 104 (FIG. 2B). Thereafter, a mask 201 comprising a silicon oxide film is formed (FIG. 2C). This mask 201 is placed to selectively introduce phosphorus.

In the state of FIG. 2C, phosphorus is doped into regions 202 and 203. A region 200 is not doped with phosphorus.

Then, a heat treatment is performed at 630° C. for 2 hours to getter the implanted phosphorus into the regions 202 and 203. That is, nickel element moves from the region 200 into the regions 202 and 203 as indicated by the arrow. The nickel element concentration in the region 200 decreases. In contrast, the nickel element concentration in the regions 202 and 203 increases.

Then, using the mask 201, the exposed silicon film is removed. That is, the nickel is gettered to the phosphorus doped region and the nickel-rich regions remove is removed.

Figure 2E:
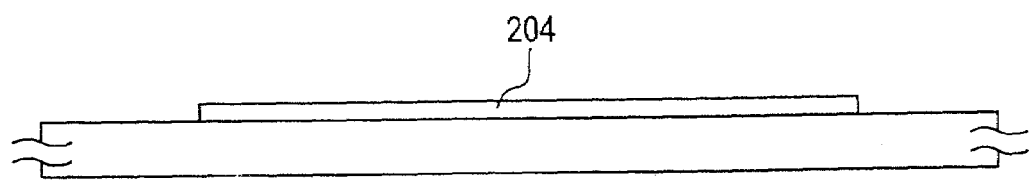

Subsequently, the mask 201 is removed, and a new mask is placed. The remaining silicon film is patterned. In this way, a silicon film pattern 204 shown in FIG. 2E is obtained. This silicon film pattern 204 will become the active layer of the TFT. The nickel element in the silicon film pattern is gettered and hence the nickel concentration in the film is decreased. After obtaining the silicon film pattern 204, the TFT is completed by the process sequence illustrated in FIGS. 1C–1D.

THIRD EMBODIMENT

The present embodiment gives an example in which P-channel TFTs are fabricated by the process sequence given in the first embodiment. First, the process steps of FIGS. 1A–1C are performed. That is, under the state of FIG. 1C, phosphorus is introduced into regions 108 and 110. Then, a heat treatment is performed to getter nickel element into the phosphorus-doped regions, as shown in FIG. 1D.

Then, boron is then implanted at a higher dose than the previous dose of phosphorus. The doped regions has P-type conductivity. In this way, P-type source and drain regions are obtained. Subsequently, the process is conducted in the same way as in the first embodiment, thus completing a TFT.

FOURTH EMBODIMENT

Figure 3A:
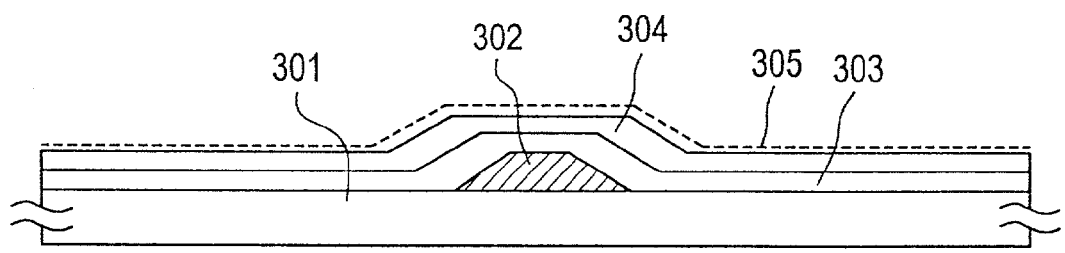
FIGS. 3A–3D are cross-sectional views illustrating a further process sequence for fabricating a TFT in accordance with the invention.

The present embodiment gives an example in which an inverted-staggered TFT is manufactured. The process sequence of the present embodiment is illustrated in FIGS. 3A–3D. First, a gate electrode pattern 302 is formed on a glass substrate 301 (FIG. 3A). The gate electrode pattern 302 is obtained by forming a titanium film and patterning it.

Then, a silicon oxide film 303 is formed as a gate insulator film by plasma CVD. Thereafter, an amorphous silicon film 304 is formed by LPCVD.

Figure 3B:
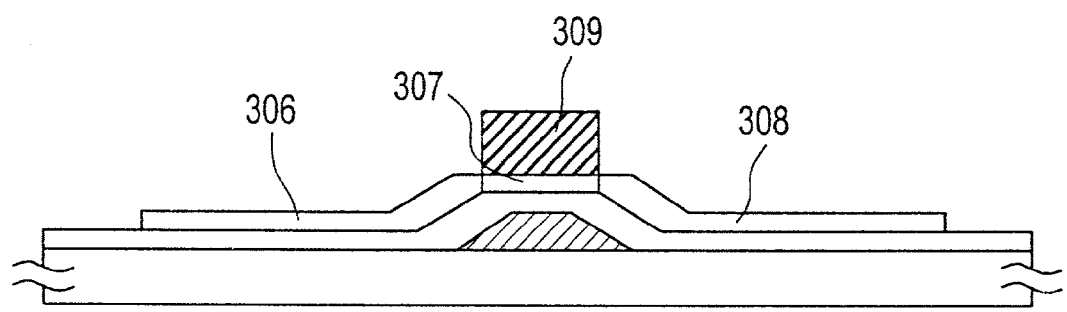

Under this condition, a nickel acetate solution is applied to maintain nickel element in contact with the surface as indicated by 305. Then, a mask 309 consisting of a silicon oxide film is formed, as shown in FIG. 3B. In this example, in order to form the silicon oxide film pattern 309, exposure is performed from the rear side (FIG. 3B).

Thereafter, phosphorus is introduced into regions 306 and 308 by plasma doping or ion implantation techniques.

At this time, a region 307 is not doped. Regions 306, 308, and 307 will later become a source region, a drain region, and a channel region, respectively (FIG. 3B).

Figure 3C:
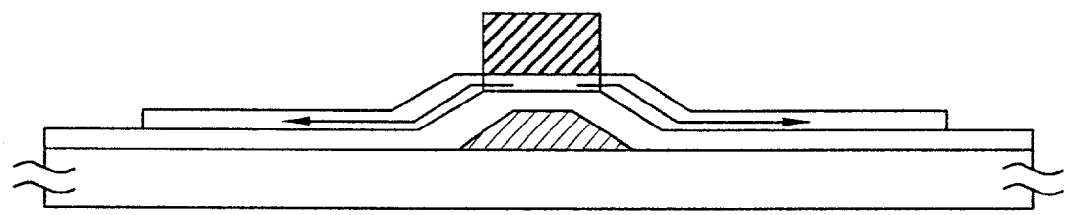
Figure 3D:
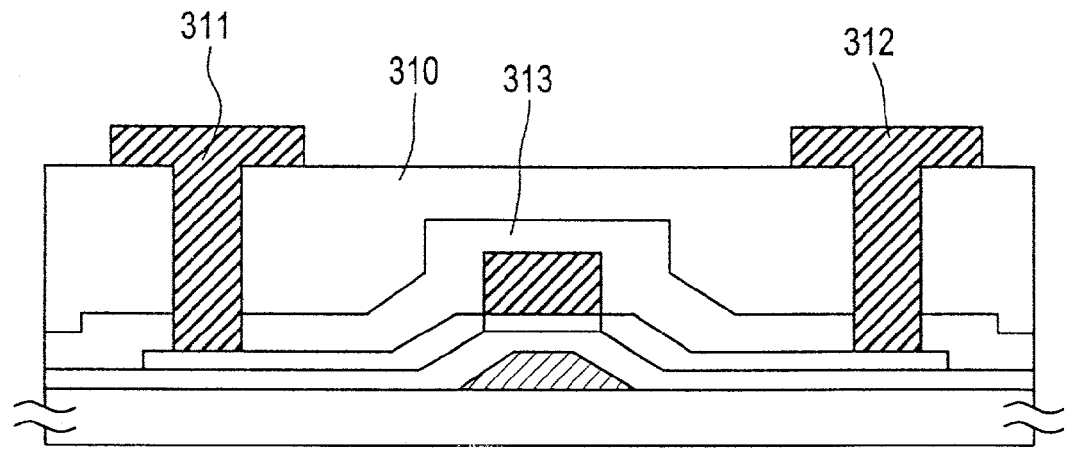

Then, a heat treatment is performed in a nitrogen atmosphere at 600° C. for 1 hour. As a result, nickel element moves from the region 307 toward the regions 306 and 308 as indicated by the arrow in FIG. 3C. That is, the nickel element in the pattern is gettered into the regions 306 and 308 (FIG. 3C).

Subsequently, an interlayer insulating film, 309 and 310, is formed. Contact holes are created. A source electrode 311 and a drain electrode 312 are completed. In this way, a bottom-gate TFT is completed.

As another configuration, the mask 309 may be formed from a silicon oxide film, and then the whole surface may be coated with amorphous silicon. Doped polysilicon may be produced. Al, Ti, Cr, Ta, or similar other material may be deposited on the surface, thus forming source/drain regions. In this case, P ions are implanted at a dose of $5\times10^{14}$ cm$^{-2}$ to form source and drain regions.

FIFTH EMBODIMENT

In the present embodiment, crystals are grown laterally, i.e., parallel to the substrate (that is, parallel to the silicon film surface), to obtain a crystalline silicon film.

Figure 4A:
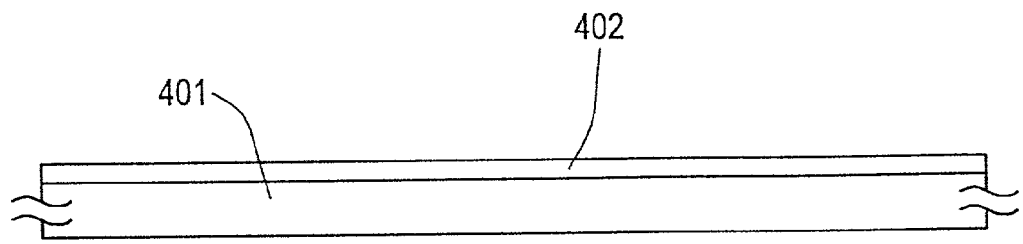
FIGS. 4A–4D are cross-sectional views illustrating a process sequence for fabricating a crystalline silicon film in accordance with the invention.
Figure 4B:
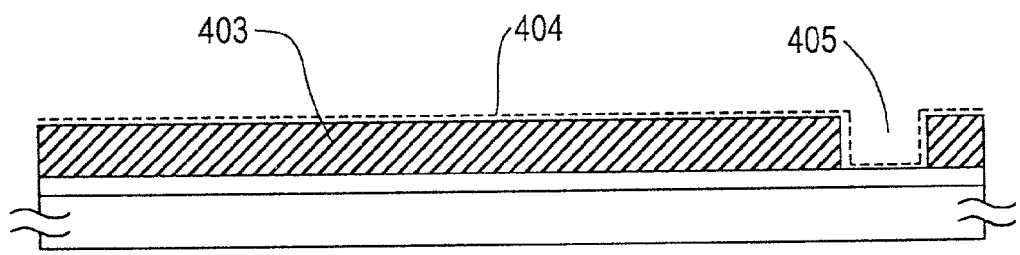

The process sequence of the present embodiment is illustrated in FIGS. 4A–4D. First, an amorphous silicon film 402 is formed on a glass substrate 401 by LPCVD (FIG. 4A). Then, a mask 403 is fabricated from a silicon oxide film. An opening 405 is formed in this mask to expose a part of the amorphous silicon film 402. This opening assumes the form of a slit extending from the front side to the rear side of the plane of the paper (FIG. 4B).

Then, nickel element is introduced. In this example, a nickel acetate solution is applied to maintain nickel element 404 in contact with the surface.

Under this condition, nickel element is selectively contacted with the surface of the amorphous silicon film 402 at the portion of the opening 405. That is, nickel is kept in contact with an elongated portion of the amorphous silicon film 402 (FIG. 4B). Nickel element may also be introduced by ion implantation.

Figure 4C:
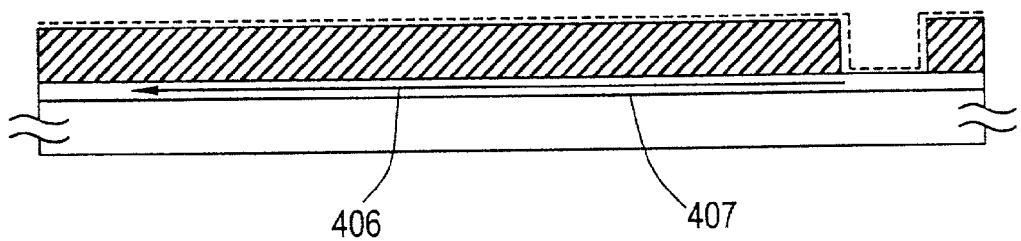

Then, a heat treatment is performed at 560° C. for 14 hours. During this process step, lateral growth takes place from the region of the opening 405 as indicated by the arrow 406. The lateral growth can be performed over a length of more than 100 μm (FIG. 4C).

Preferably, this heat treatment is carried out at a temperature of approximately 570° C. to 580° C. If the heat treatment were effected above this range, crystal growths other than lateral growth (i.e., crystal growths that are only induced by heating without the action of nickel) would progress. In consequence, lateral growth would be impeded. In this manner, a silicon film 407 having laterally grown regions is obtained (FIG. 4C).

Then, the mask 403 comprising the silicon oxide film is removed. The exposed silicon film is patterned to produce a silicon film pattern 408 shown in FIG. 4D.

The silicon film pattern 408 obtained in this way has a peculiar structure, i.e., pillar-shaped crystals lie in a row in the direction of crystal growth. The crystal growth direction is made coincident with the direction of movement of carriers in the channel region. In consequence, TFTs having high mobilities can be obtained.

This lateral growth technique is very effective in controlling the state of crystal grains. That is, where a polycrystalline silicon film is used, the TFT characteristics are affected greatly by the presence or absence of crystal grains. Where lateral growth techniques are employed, it is possible to control the presence of crystal grains. Therefore, the adverse effects of the presence on the TFT characteristics can be suppressed. This is important in matching the characteristics of many TFTs.

Figure 4D:
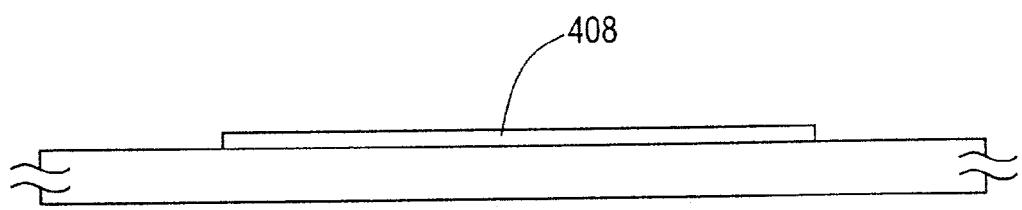

After obtaining the silicon film pattern 408 shown in FIG. 4D, TFTs are fabricated by the process sequence shown in FIG. 1C and the following figures.

SIXTH EMBODIMENT

The present embodiment is a combination of the lateral growth technique of the fifth embodiment and a nickel-gettering technique using phosphorus doping. The process sequence of the present embodiment is illustrated in FIGS.

Figure 5A:
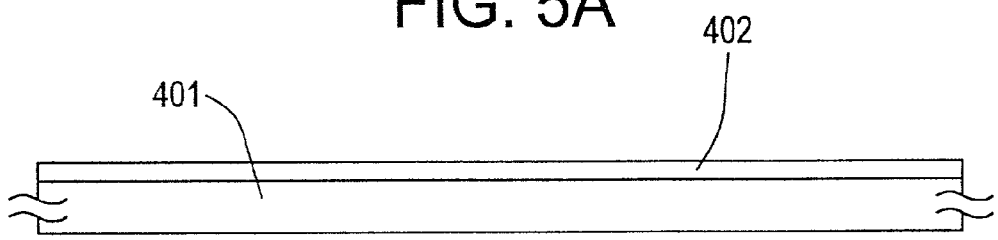
FIGS. 5A–5E are cross-sectional views illustrating another process sequence for fabricating a crystalline silicon film in accordance with the invention.
Figure 5B:
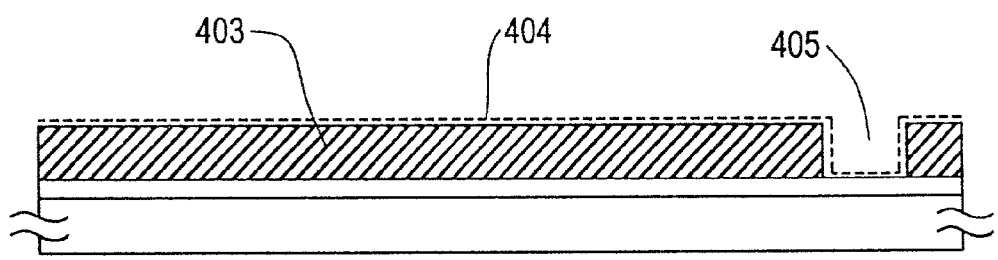
Figure 5C:
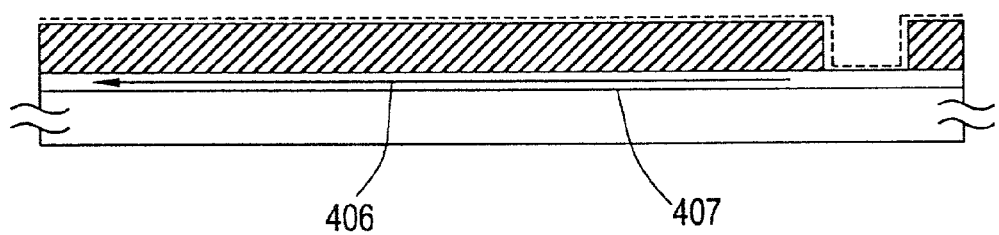

5A–5E. First, an amorphous silicon film 402 is formed on a glass substrate 401 as shown in FIG. 5A. Then, a mask 403 consisting of a silicon oxide film having openings is placed. A nickel acetate solution is applied. Thus, nickel element is kept in contact with the surface as indicated by 404. Subsequently, a heat treatment is performed to induce lateral growth as indicated by 406. In consequence, a crystalline silicon film 407 is obtained (FIG. 5C).

Figure 5D:
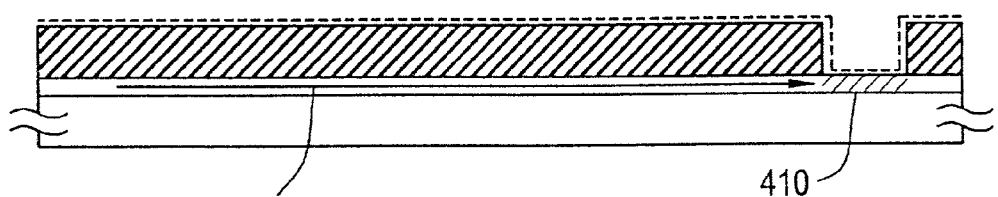
Figure 5E:
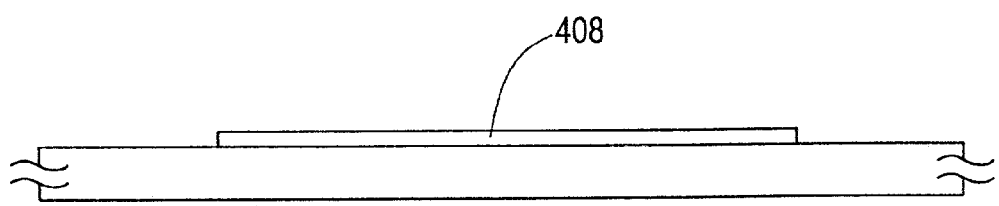

Using the mask 403, phosphorus is introduced by plasma doping or ion implantation. During this process step, phosphorus is introduced into a region 410. Thereafter, a heat treatment is carried out at 620° C. for 1 hour in a nitrogen atmosphere. During this processing step, nickel element moves as indicated by the arrow 409. The result is that nickel element is concentrated in the phosphorus-doped region 410. Although the nickel element is diffused by the crystal growth step illustrated in FIG. 5C, the heat treatment getters the diffused nickel into the region 410 (FIG. 5D).

The obtained silicon film is patterned to obtain an active layer 408 for a TFT. Subsequently, the process is conducted in the same way as in the first embodiment to complete the TFT.

SEVENTH EMBODIMENT

The present embodiment gives examples of devices or apparatus using TFTs according to other embodiments. FIGS. 6A–6F show examples of various semiconductor devices. These semiconductor devices include TFTs at least in their parts.

Figure 6A:
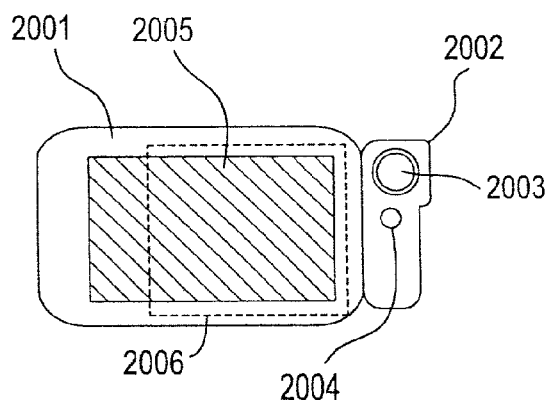
FIGS. 6A–6F are views illustrating various commercial products using TFTs in accordance with the invention.

Shown in FIG. 6A is a portable intelligent terminal. The body of this terminal, indicated by 2001, has an active matrix liquid crystal display or an active matrix EL display and a camera portion 2002 for accepting information from the outside. The camera portion 2002 is equipped with an image-receiving portion 2003 and an operation switch 2004. It is considered that the portable intelligent terminal will be made increasingly thinner or lighter to improve the portability.

In this configuration, an active matrix display 2005 is formed on a substrate. Preferably, peripheral driver circuits, arithmetic units, and memories are fabricated as an integrated circuit from TFTs.

Figure 6B:
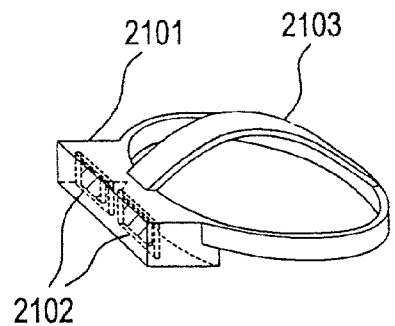

Referring to FIG. 6B, there is shown a head mounted display whose body is indicated by 2101. This body 2101 is fitted with an active matrix liquid crystal display or EL display 2102. A user can wear the body 2102 on his or her head with a band 2103.

Figure 6C:
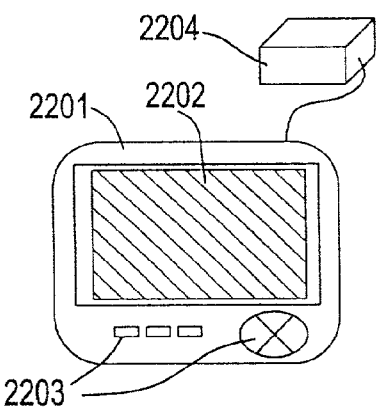

Referring next to FIG. 6C, there is shown a front-projection type liquid crystal display. The body of this display is indicated by 2201 and provided with a light source 2202. Light image from this light source is optically modulated by a reflective liquid crystal display 2203, enlarged by optics 2204, and projected onto a screen 2205.

In this structure, the optics 2204 are required to be minimized in size because of cost considerations. Correspondingly, the display unit 2203 is required to be reduced in size.

Where the active matrix flat panel display is reduced in size, it is required that even peripheral driver circuits driving the active matrix circuit be integrated with the active matrix circuit on the same substrate. Specifically, where the active matrix circuit is miniaturized, if circuits forming the peripheral driver circuits are made of an externally attached IC, it is difficult to mount it. Therefore, the display unit 2203 comprises a substrate on which an active matrix circuit composed of TFTs is integrated with peripheral driver circuits composed of TFTs. In this example, the liquid crystal display 2503 is of the reflective type. The liquid crystal display may also be of the transmissive type. In this case, the optics must be modified.

Figure 6D:
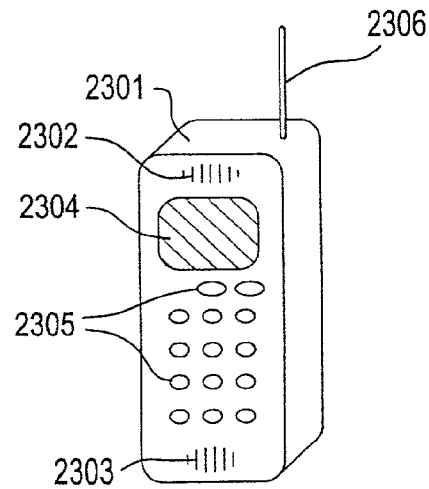

Referring next to FIG. 6D, there is shown a cellular mobile telephone. The body of this telephone is indicated by numeral 2301 and fitted with an active matrix liquid crystal display 2304, operation switches 2305, a speech input portion 2303, a speech output portion 2302, and an antenna 2306.

Recently, a combination of the portable intelligent terminal shown in FIG. 6A and the cellular mobile telephone shown in FIG. 6D has been commercialized.

Figure 6E:
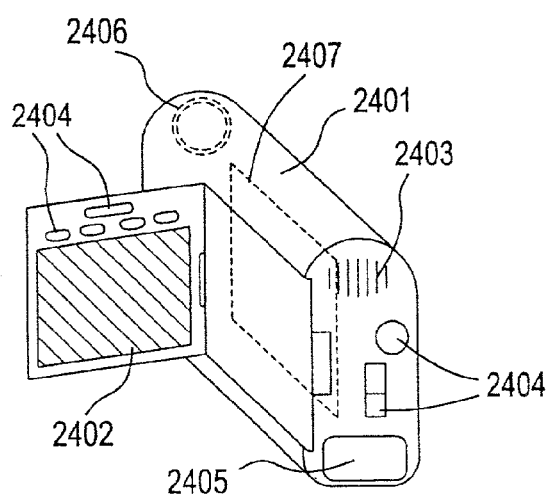

Referring next to FIG. 6E, there is shown a portable video camera. The body of this camera is indicated by 2401 and has an image-receiving portion 2406, a speech input portion 2403, operation switches 2404, an active matrix liquid crystal display 2402, and batteries 2405.

Figure 6F:
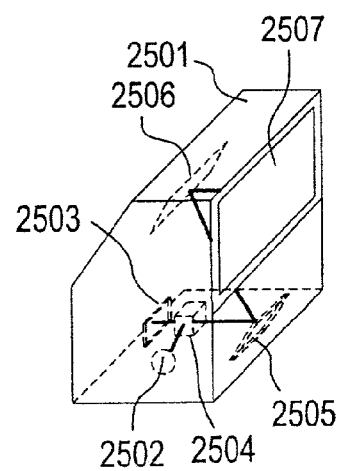

Referring to FIG. 6F, there is shown a rear-projection liquid crystal display. The body of this display is denoted by 2501 and fitted with a projection screen. Light from a light source 2502 is separated by a polarizing beam splitter 2504, optically modulated by a reflective liquid crystal display 2503, and reflected toward the screen 2507 by reflectors 2505 and 2506. In this example, the liquid crystal display 2503 is of the reflective type. Instead, a transmissive liquid crystal display may be used. In this case, the optics are modified.

The present invention disclosed herein can be applied to various digital circuits, RF modular circuits, arithmetic units, CPUs, and so on.

Where the present invention is adopted, when a catalytic element is gettered source/drain regions, these regions are simultaneously annealed. In addition, the catalytic element can be removed from the channel region. In consequence, TFTs having excellent characteristics can be fabricated with a high yield.

Besides, material of a gate electrode is not restricted to a metal used in the embodiments. That is, material having heat-resistance to the heat treatment after phosphorus doping can be used (e.g. tantalum or a material containing tantalum).

What is claimed is:

1. A semiconductor device comprising:
    an active layer comprising a semiconductor film comprising silicon;
    a gate electrode comprising tantalum adjacent to said active layer with a gate insulating film interposed therebetween;
    an inorganic film over said active layer and on said gate electrode; and
    a resin film over said inorganic film,
    wherein a concentration of nickel in a source region and a drain region formed in said active layer is higher than a concentration of nickel in other regions in said active layer by two or more orders of magnitude, and
    wherein said source region and said drain region comprise a nickel phosphide.

2. The semiconductor device according to claim 1, wherein said nickel phosphide is one of NiP, $NiP_2$ and $Ni_2P$.

3. The semiconductor device according to claim 1, wherein said semiconductor device is one selected from the group consisting of a portable intelligent terminal, a head mounted display, a front-projection type liquid crystal display, a cellular mobile telephone, a portable video camera, and a rear-projection liquid crystal display.

4. The semiconductor device according to claim 1, wherein said gate electrode has a heat-resistance to a heat treatment of 700° C.

5. The semiconductor device according to claim 1, wherein said resin film comprises a material selected from the group consisting of acrylics, polyimide, polyamide, polyimidamide, and epoxies.

6. A semiconductor device comprising:
an active layer comprising a semiconductor film comprising silicon;
a gate electrode comprising tantalum adjacent to said active layer with a gate insulating film interposed therebetween;
a film comprising silicon and nitride over said active layer and on said gate electrode; and
a resin film over said film comprising silicon and nitride,
wherein a concentration of nickel in a source region and a drain region formed in said active layer is higher than a concentration of nickel in other regions in said active layer by two or more orders of magnitude, and
wherein said source region and said drain region comprise a nickel phosphide.

7. The semiconductor device according to claim 6, wherein said nickel phosphide is one of NiP, NiP$_2$ and Ni$_2$P.

8. The semiconductor device according to claim 6, wherein said gate electrode has a heat-resistance to a heat treatment of 700° C.

9. The semiconductor device according to claim 6, wherein said semiconductor device is one selected from the group consisting of a portable intelligent terminal, a head mounted display, a front-projection type liquid crystal display, a cellular mobile telephone, a portable video camera, and a rear-projection liquid crystal display.

10. The semiconductor device according to claim 6, wherein said resin film comprises a material selected from the group consisting of acrylics, polyimide, polyamide, polyimidamide, and epoxies.

11. A semiconductor device comprising:
an active layer comprising a semiconductor film comprising silicon;
a gate electrode comprising tantalum adjacent to said active layer with a gate insulating film interposed therebetween;
an inorganic film over said active layer and on said gate electrode; and
a resin film over said inorganic film,
wherein a concentration of nickel in a source region and a drain region formed in said active layer is higher than a concentration of nickel in other regions in said active layer which is less than $5 \times 10^{16}$ atoms/cm$^3$, and
wherein said source region and said drain region comprise a nickel phosphide.

12. The semiconductor device according to claim 11, wherein said nickel phosphide is one of NiP, NiP$_2$ and Ni$_2$P.

13. The semiconductor device according to claim 11, wherein said gate electrode has a heat-resistance to a heat treatment of 700° C.

14. The semiconductor device according to claim 11, wherein said semiconductor device is one selected from the group consisting of a portable intelligent terminal, a head mounted display, a front-projection type liquid crystal display, a cellular mobile telephone, a portable video camera, and a rear-projection liquid crystal display.

15. The semiconductor device according to claim 11, wherein said resin film comprises a material selected from the group consisting of acrylics, polyimide, polyamide, polyimidamide, and epoxies.

16. A semiconductor device comprising:
an active layer comprising a semiconductor film comprising silicon;
a gate electrode comprising a heat-resistant material adjacent to said active layer with a gate insulating film interposed therebetween;
a film comprising silicon and nitride over said active layer and on said gate electrode; and
a resin film over said film comprising silicon and nitride,
wherein a concentration of nickel in a source region and a drain region formed in said active layer is higher than a concentration of nickel in other regions in said active layer which is less than $5 \times 10^{16}$ atoms/cm$^3$, and
wherein said source region and said drain region comprise a nickel phosphide.

17. The semiconductor device according to claim 16, wherein said nickel phosphide is one of NiP, NiP$_2$ and Ni$_2$P.

18. The semiconductor device according to claim 16, wherein said gate electrode has a heat-resistance to a heat treatment of 700° C.

19. The semiconductor device according to claim 16, wherein said semiconductor device is one selected from the group consisting of a portable intelligent terminal, a head mounted display, a front-projection type liquid crystal display, a cellular mobile telephone, a portable video camera, and a rear-projection liquid crystal display.

20. The semiconductor device according to claim 16, wherein said resin film comprises a material selected from the group consisting of acrylics, polyimide, polyamide, polyimidamide, and epoxies.

21. A semiconductor device comprising:
an active layer comprising a semiconductor film comprising silicon;
a gate electrode comprising tantalumadjacent to said active layer with a gate insulating film interposed therebetween;
an inorganic film over said active layer and on said gate electrode; and
a resin film over said inorganic film,
wherein a source region and a drain region formed in said active layer comprise a nickel phosphide.

22. The semiconductor device according to claim 21, wherein said nickel phosphide is one of NiP, NiP$_2$ and Ni$_2$P.

23. The semiconductor device according to claim 21, wherein said gate electrode has a heat-resistance to a heat treatment of 700° C.

24. The semiconductor device according to claim 21, wherein said semiconductor device is one selected from the group consisting of a portable intelligent terminal, a head mounted display, a front-projection type liquid crystal display, a cellular mobile telephone, a portable video camera, and a rear-projection liquid crystal display.

25. The semiconductor device according to claim 21, wherein said resin film comprises a material selected from the group consisting of acrylics, polyimide, polyamide, polyimidamide, and epoxies.

26. A semiconductor device comprising:
an active layer comprising a semiconductor film comprising silicon;
a gate electrode comprising tantalum adjacent to said active layer with a gate insulating film interposed therebetween;
a film comprising silicon and nitride over said active layer and on said gate electrode; and
a resin film over said film comprising silicon and nitride,
wherein a source region and a drain region formed in said active layer comprise a nickel phosphide.

27. The semiconductor device according to claim 26, wherein said nickel phosphide is one of NiP, NiP$_2$ and Ni$_2$P.

28. The semiconductor device according to claim 26, wherein said gate electrode has a heat-resistance to a heat treatment of 700° C.

29. The semiconductor device according to claim 26, wherein said semiconductor device is one selected from the group consisting of a portable intelligent terminal, a head mounted display, a front-projection type liquid crystal display, a cellular mobile telephone, a portable video camera, and a rear-projection liquid crystal display.

30. The semiconductor device according to claim 26, wherein said resin film comprises a material selected from the group consisting of acrylics, polyimide, polyamide, polyimidamide, and epoxies.

* * * * *